United States Patent [19]

Anceau

[11] Patent Number: 5,293,063
[45] Date of Patent: Mar. 8, 1994

[54] MONOLITHIC STRUCTURE COMPRISING TWO SETS OF BIDIRECTIONAL PROTECTION DIODES

[75] Inventor: Christine Anceau, Saint Roch, France

[73] Assignee: SGS-Thomson Microelectronics S.A., Gentilly, France

[21] Appl. No.: 834,052

[22] Filed: Feb. 11, 1992

[30] Foreign Application Priority Data

Feb. 12, 1991 [FR] France ............... 91/01975

[51] Int. Cl.⁵ .......................................... H01L 29/06
[52] U.S. Cl. ................................. 257/653; 257/355; 257/362
[58] Field of Search ............... 257/355, 356, 362, 497, 257/653, 654, 551, 603, 606, 589, 328

[56] References Cited

U.S. PATENT DOCUMENTS

| | | |
|---|---|---|
| 4,468,852 | 9/1984 | Cerofolini ............... 257/376 |
| 4,574,467 | 3/1986 | Halfacre et al. ........... 257/376 |
| 4,622,573 | 11/1986 | Bakeman, Jr. et al. ...... 257/376 |

FOREIGN PATENT DOCUMENTS

| | | | |
|---|---|---|---|
| 61-206269 | 9/1986 | Japan | .............. 257/653 |
| 1-130554 | 5/1989 | Japan | .............. 257/355 |

*Primary Examiner*—Sara W. Crane
*Attorney, Agent, or Firm*—Lowe, Price, LeBlanc & Becker

[57] ABSTRACT

A monolithic structure comprises two sets of bidirectional diodes having distinct characteristics constituted from a substrate (1) of a first (N⁻) conductivity type. First regions (10, 11, 12) of the second conductivity type constitute the first set of diodes between a first metallization (30) coating one of the first regions and second metallizations (31, 32) coating the other first regions. In a well (15) of the second conductivity type, second regions (20, 21, 22) of the first conductivity type constitute the second set of diodes between a third metallization (40) coating one of the second regions and fourth metallizations (41, 42) coating the other second regions.

5 Claims, 3 Drawing Sheets

MONOLITHIC STRUCTURE COMPRISING TWO SETS OF BIDIRECTIONAL PROTECTION DIODES

BACKGROUND OF THE INVENTION

The present invention relates to protection diodes. Protection diodes are here diodes that clip the voltage across their terminals as soon as the latter reaches a predetermined value, called breakdown voltage, of any polarity. Such diodes are commonly used at the input of electronic devices liable to receive spurious pulses, such as circuits connected to telephone lines. In practice, the breakdown voltage of these diodes must be accurately determined (usually from 5 to 10%) in order not to impair the circuit they are intended to protect.

The invention more particularly relates to the case when it is desired to protect first lines from overvoltages of a first level and second lines from overvoltages of a second level. This is schematically illustrated in FIG. 1 in which a first set of conductors L11, L12 ... and a second set of conductors L21, L22 ... are represented. It is desired to protect the first set of conductors with respect to a common terminal C by first bidirectional breakdown diodes D11, D12 ... and the second set of conductors by second bidirectional breakdown diodes D21, D22 ... Diodes D11, D12 ... of the first set break down when the voltage across their terminals exceeds in absolute value a voltage V1 and diodes D21, D22 ... of the second set break down when the voltage across their terminals exceeds in absolute value a voltage V2. In the following it is assumed that V2 is higher than V1.

In the prior art, to provide a protection of the type required in FIG. 1, discrete protection diodes or monolithic circuits, each incorporating a set of protection diodes having a predetermined breakdown voltage, have been used. In both cases, long and sometimes complex assembling is to be achieved.

Thus, an object of the invention is to provide one monolithic integrated structure grouping two sets of protection diodes, each of these sets having distinct breakdown characteristics.

A further object of the invention is to provide such a structure which is simple to manufacture for predetermined couples of breakdown voltages.

SUMMARY OF THE INVENTION

To achieve this object, the invention provides a monolithic structure comprising two sets of bidirectional diodes with distinct characteristics constituted by a substrate of a first conductivity type, from a surface of which are achieved first regions of the second conductivity type for constituting the first set of diodes between a first metallization coating one of the first regions and second metallizations coating the other first regions. This structure comprises a well of the second conductivity type formed from said surface, in which are formed second regions of the first conductivity type for constituting the second set of diodes between a third metallization coating one of the second regions and fourth metallizations coating the other second regions.

According to an aspect of the invention, layers of the second conductivity type, more highly doped than the well, are provided at the interface between the bottoms of the second regions and the well.

BRIEF DESCRIPTION OF THE DRAWINGS

The foregoing and other objects, features and advantages of the invention will be apparent from the following detailed description of preferred embodiments as illustrated in the accompanying figures wherein.

Figure 2:
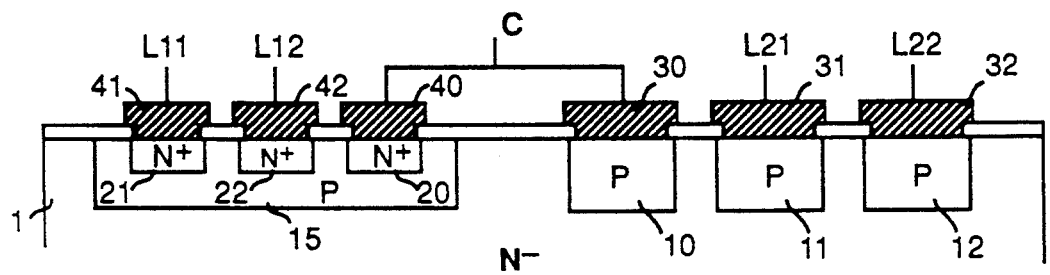
FIG. 2 shows a first embodiment of the invention.
Figure 4:
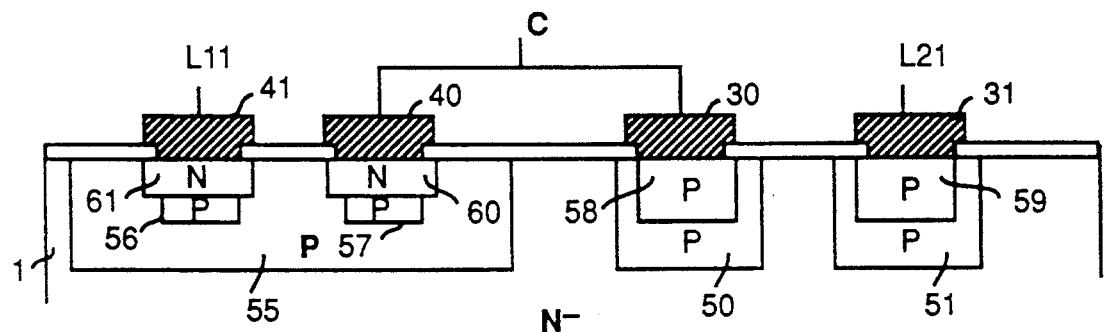
FIG. 4 shows a second embodiment of the invention.

As conventional in integrated circuit representation, it will be noted that the structures of FIGS. 2 and 4 are very schematically represented and are not drawn to scale. The various dimensions are arbitrarily enlarged in order to facilitate the legibility of the drawings. Similarly, while the corners of the various diffused regions and wells are illustrated with square right angles, those skilled in the art will note that in practice junction corners are rounded up due to diffusion and annealing steps.

DETAILED DESCRIPTION OF THE INVENTION

As shown in FIG. 2, the first embodiment of the invention is manufactured from a low-doped semiconductor substrate 1 of a first conductivity type, here N$^-$. In a first portion of this substrate are formed P-type regions 10, 11, 12 and in a second portion of this substrate is formed a P-type well 15. Regions 10, 11, 12 and well 15 can result from one diffusion step. Inside well 15 are formed N$^+$-type regions 20, 21, 22. Each region 10, 11, 12 is coated with a metallization 30, 31, 32 and each region 20, 21, 22 is coated with a metallization 40, 41, 42.

Figure 1:
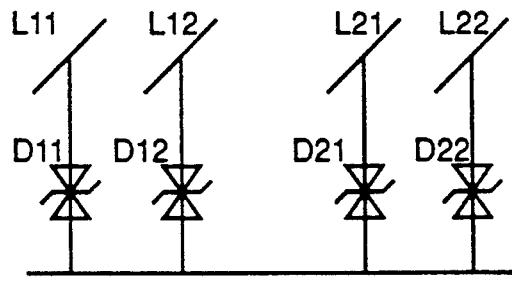
FIG. 1, above described, shows line protection diodes.

In order to achieve a circuit of the type shown in FIG. 1, metallizations 30 and 40 are connected to terminal C, metallizations 31 and 32 to conductors L21 and L22, respectively, and metallizations 41 and 42 to conductors L11 and L12, respectively. Thus, first bidirectional protection diodes are obtained between conductors L21, L22 and terminal C and second bidirectional protection diodes between conductors L11, L12 and terminal C. The second bidirectional protection diodes comprise a PN junction between the P regions 11, 12 and the N$^-$ substrate and an NP junction between the N$^-$ substrate and the P region 10. The first bidirectional diodes comprise an NP junction between the N$^+$ regions 21, 22 and the P well and a PN junction between the P well and the N region 20. Thus, these diodes are actually symmetrical.

The breakdown voltage of the diodes formed between regions 10, 11, 12 and the N$^-$ substrate mainly depends upon the doping of the least doped layer, the N$^-$ substrate, and the diffusion profile of the P/N$^-$ junction. The breakdown voltage of the diodes formed between the N$^+$ regions 20, 21, 22 and the P well mainly depends upon the doping level of this well which is in turn more highly doped than the substrate. Thus, the diodes formed in the well will have a lower breakdown voltage than those directly formed in the substrate. On the other hand, if the P well 15 is identical to the P regions 10, 11, 12, the junction between the well and the substrate will have the same breakdown voltage as the junction between the regions 10, 11, 12 and the substrate. Therefore, a high voltage on one of the conductors L21 and L22 will not cause breakdown towards one of the conductors L11 and L12. More generally, the breakdown voltage between the P well 15 and substrate 1 will be chosen higher than or equal to the breakdown voltage between the P regions 10, 11, 12 and this substrate.

Figure 3A:
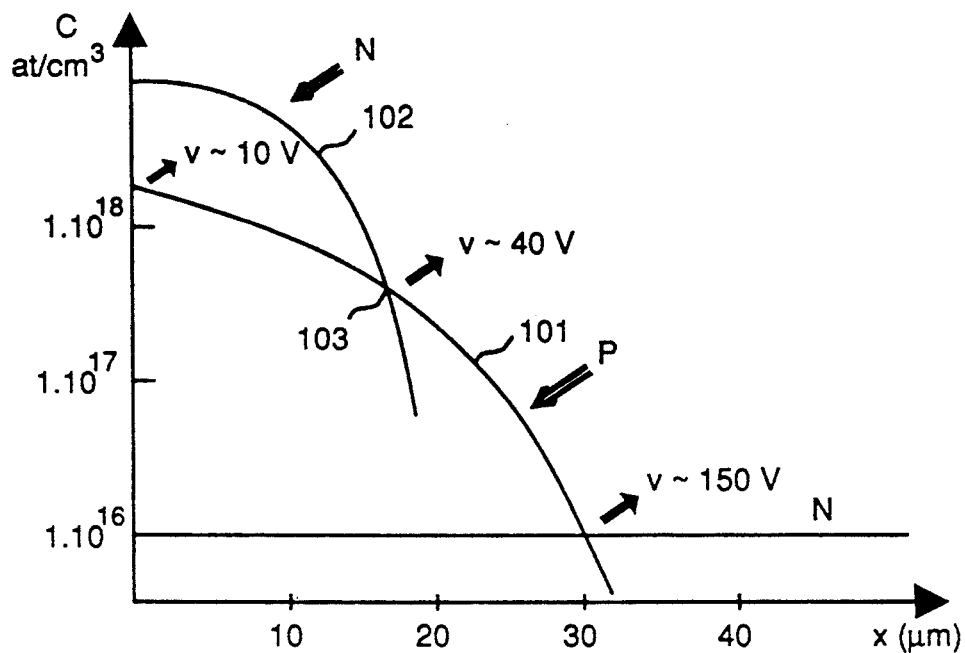
FIGS. 3A and 3B show concentration curves of a dopant as a function of depth in two specific implementations of the first embodiment of the invention.
Figure 3B:
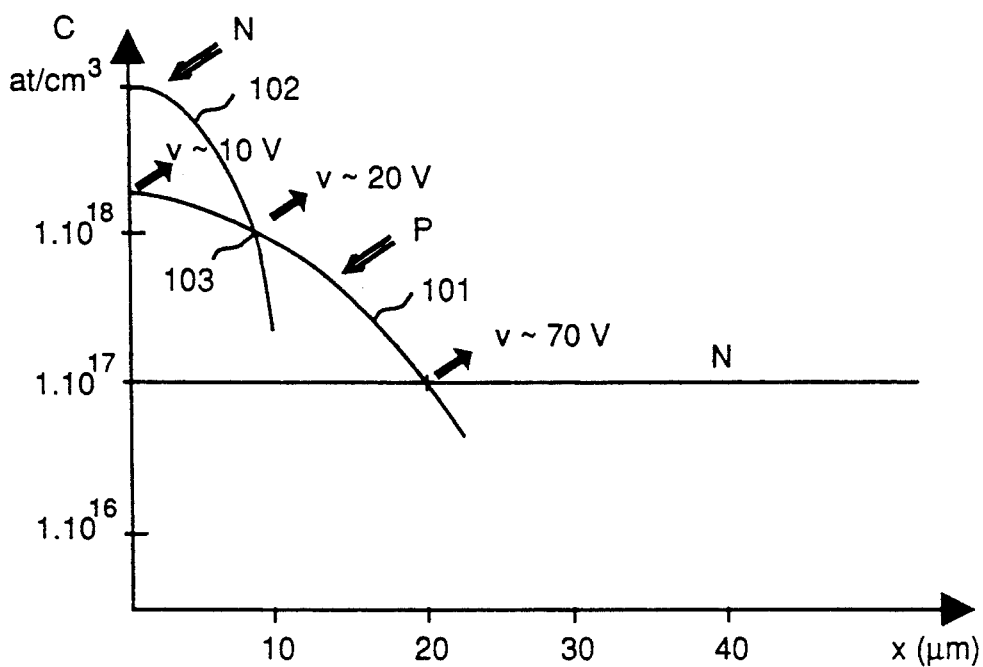

FIGS. 3A and 3B show exemplary diffusion profiles for a structure of the type shown in FIG. 2. It is considered that the N− substrate has a homogeneous doping level. It is, for example, a bulk substrate or an epitaxial layer formed on a substrate. Also, it is considered that the various doped regions or wells result from diffusions and annealings achieved from predeposits of doped substances at the surface of these regions and wells. Of course, various variants in the diffusion and annealing modes can be devised by those skilled in the art. For example, implantation steps followed by annealings could be substituted to diffusion steps from predeposit. The doping profiles shown in FIGS. 3A and 3B correspond to final profiles after the last annealing steps.

In the case of FIG. 3A, the doping level of the substrate is $10^{16}$ atoms/cm$^3$, which corresponds to a breakdown voltage of about 150 volts. But, the well 15 has an inhomogeneous doping level which decreases from the surface (x=0) to the bottom of the well as shown by curve 101. Similarly, the N regions 20, 21, 22 have a doping level which decreases from the surface to the bottom as shown by curve 102. Thus, at the surface, the N region contacts the P well at a position (x=0) where the P well is highly doped (concentration higher than $10^{18}$ atoms/cm$^3$). As a result, a breakdown voltage of about 10 volts occurs at the surface. But, considering the intersection of curves 101 and 102, at point 103, which corresponds to the bottom of regions 20, 21, 22, the breakdown voltage would be 40 volts. However, this breakdown voltage at point 103 does not affect the operation of the device since the breakdown will first occur at the surface for the lowest voltage value.

FIG. 3B shows another doping pattern wherein the N-type substrate is doped at $10^{17}$ atoms/cm$^3$ causing a breakdown voltage of about 70 volts for the diodes formed between the P regions 10, 11, 12 and the substrate 1. A curve 101 corresponding to the P-type diffusion substantially identical to the curve 101 of FIG. 3A is represented. Indeed, with the conventional techniques of dopant predeposit, it is difficult to make the surface concentration vary. The low breakdown voltage will therefore remain substantially equal to 10 volts as in the previous case and it will not be possible to have it substantially changed, which gives little flexibility for manufacturing such a structure. Indeed, a longer annealing time will slightly decrease the surface concentration but will mainly change the position of the intersection point 103 between curves 101 and 102.

In order to avoid this drawback, the invention further provides a structure, illustrated in FIG. 4, enabling to more easily select the value of the high and low breakdown voltages. This structure is manufactured from a low doped substrate 1 of a first (N−) conductivity type. In this substrate, there are again, on the one hand, P-type regions 50, 51, and, on the other hand, a P-type well 55. During a subsequent masking step, more highly doped P-type diffusions 56, 57 are achieved in the well then N-type regions 60, 61. Regions 60, 61 are in register with regions 56 and 57 over a larger width so that regions 56 and 57 occupy the bottom of regions 60 and 61 without overlapping the edges of these regions. Also, inside the P regions 50 and 51, respective more highly doped P regions 58 and 59 are shown, regions 58 and 59 being formed during the same step as diffusions 56 and 57. Then, metallizations 30, 31, 40, 41 are formed for contacting regions 58, 59, 60 and 61. In operation, region 59 is connected to a conductor L21, regions 58 and 60 are connected to a common terminal C and region 61 to a conductor L11. Metallizations 30 and 40 can be directly connected on the chip by forming an uninterrupted metallization between regions 58 and 60.

In the case of FIG. 2, two high voltage bidirectional diodes and two low voltage bidirectional diodes are represented, while in FIG. 4, one high voltage bidirectional diode and one low voltage bidirectional diode are represented. Those skilled in the art will note that in both cases any number of bidirectional diodes can be chosen, possibly much more than two, if the circuit to be protected has a large number of conductors.

In the structure of FIG. 4, the operation of the high voltage diodes corresponding to the P regions 50, 51 directly formed in the substrate is similar to that of FIG. 2. The overdoped regions 58 and 59 are intended to ensure a better ohmic contact with metallizations, since, as will be seen later on, the P regions 50 and 51 are less doped than regions 10, 11, 12 of FIG. 2.

The specificity of the embodiment of FIG. 4 lies essentially in the structure of the low voltage diodes formed in well 55. Indeed, the P well 55 is lowly doped so that, at the junction between the P regions 56 and 57 and N regions 60 and 61, the doping level of the P regions 56 and 57 is higher than the doping level of the P well 55, even at the surface.

Figure 5A:
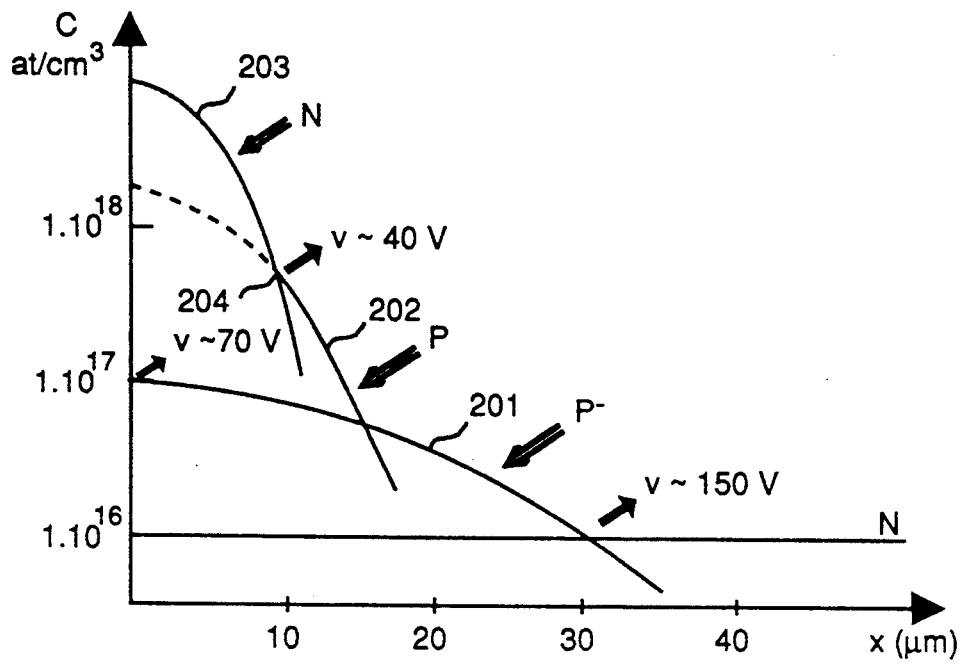
FIGS. 5A and 5B show concentration curves of a dopant as a function of depth in two specific implementations of the second embodiment of the invention.
Figure 5B:
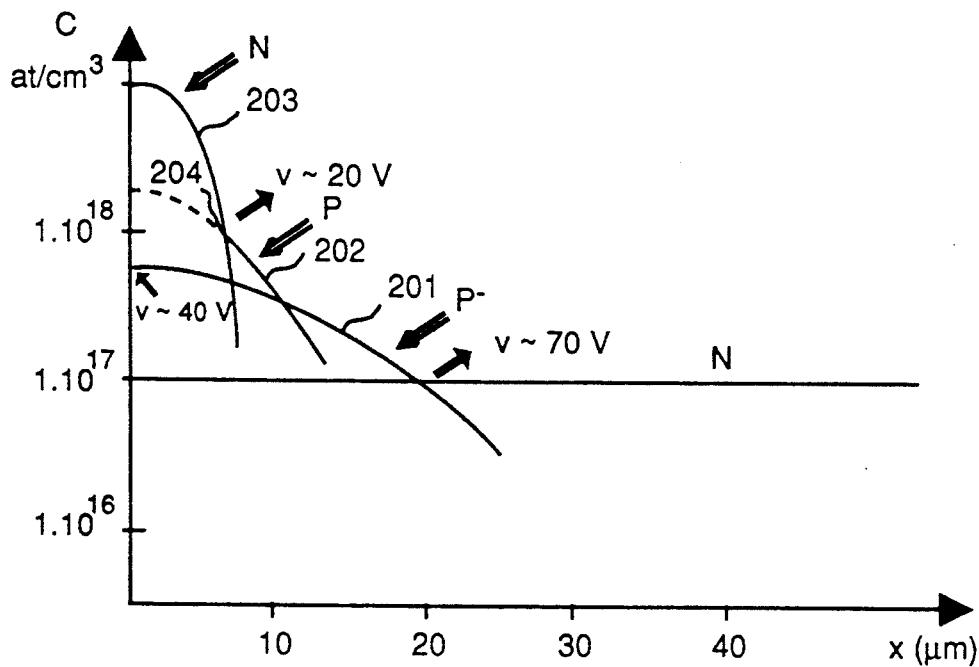

Examples of the doping patterns of the structure of FIG. 4 are illustrated in FIGS. 5A and 5B.

In the case of FIG. 5A, the doping level of substrate 1 is about $10^{16}$ atoms/cm$^3$ causing a breakdown voltage of about 150 volts for the second set of bidirectional diodes. Curve 201 illustrates the concentration profile of the P well 15 (and of the P regions 50, 51). Curve 202 shows the diffusion profile of the P regions 56 and 57. Curve 203 shows the concentration profile of the N regions 60, 61. The breakdown voltage of the PN junctions 56–61 and 57–60 corresponds to the operation point 204. In the given example, this breakdown voltage is about 40 volts. It will be noted that this value is lower than the breakdown voltage (about 70 volts) appearing at the superficial junction of the N regions 60, 61 with well 55. Therefore, junctions 56, 61 and 57, 60 actually determine the breakdown voltage of the first set of bidirectional diodes.

The doping level at point 204 can be adjusted by adequately setting the annealing times which, it is to be reminded, do not substantially affect the values of the surface doping.

This is illustrated by FIG. 5B where a high breakdown voltage of about 70 volts is chosen (the doping level of the substrate being about $10^{17}$ atoms/cm$^3$). In the case represented, the voltage determined by point 204 is about 20 volts while the voltage determined at the surface by the contact between the N regions 60, 61 and the well 55 is about 40 volts and does not therefore affect the operation of the system.

Thus, the invention provides, on the one hand, as described in relation with FIG. 2, a monolithic structure incorporating two sets of bidirectional protection diodes having respectively high and low breakdown voltages and, on the other hand, as described in connection with FIG. 4, such a monolithic structure having the advantage of allowing a simple adjustment of the high and low breakdown voltages.

Of course, the invention is liable of numerous variants and modifications which will appear to those skilled in the art who will especially be able to reverse all the described types of conductivity.

I claim:

1. Protective system for at least two groups of electrical lines exposed to different breakdown voltages per group, comprising:
   a plurality of head-to-tail diodes each connected between a reference potential and a corresponding one of said lines, said head-to-tail diodes forming a set of diodes for each group of lines and for each one of said breakover voltages;
   wherein said sets of diodes are monolithically assembled about a common substrate of a first conductivity type disposed in a plane;
   wherein each of said set of diodes includes a plurality of regions of a conductivity different from said substrate and formed in parallel upon said substrate, each being provided with a metallisation on top of it, one metallisation being connected to said reference potential to form with the associated region a single and common tail diode for the set, the other metallisations of a set being connected to the respective lines of the same group to form the respective head diodes thereof.

2. The protective system of claim 1 wherein the regions of one set of diodes are of a second conductivity type, and wherein the regions of another set of diodes are of the same said first conductivity type and being disposed within a common well of said second conductivity type interposed between said common substrate and each of said first conductivity type regions.

3. The protective system of claim 2 wherein said first conductivity type regions are heavily doped in accordance with the corresponding breakdown voltage.

4. The protective system of claim 1 wherein the regions of each of said sets are of a second conductivity type, the regions of one set being heavier doped than the regions of the other set the doping thereof being in relation to the difference between group breakdown voltages.

5. The protective system according to claim 1 wherein the regions of each of said sets are of said first conductivity type with a zone of a second conductivity type being provided interposed between a corresponding region and said subjacent substrate, the regions of one set being heavier doped than the regions of the other set in relation to the difference between the respective group breakdown voltages.

* * * * *